(12) United States Patent
Montenegro

(10) Patent No.: US 11,508,539 B2
(45) Date of Patent: Nov. 22, 2022

(54) VOLTAGE READINGS USING HIGH VOLTAGE RESISTOR ACROSS VACUUM INTERRUPTER

(71) Applicant: S&C Electric Company, Chicago, IL (US)

(72) Inventor: Alejandro Montenegro, Chicago, IL (US)

(73) Assignee: S&C Electric Company, Chicago, IL (US)

( * ) Notice: Subject to any disclaimer, the term of this patent is extended or adjusted under 35 U.S.C. 154(b) by 0 days.

(21) Appl. No.: 17/489,940

(22) Filed: Sep. 30, 2021

(65) Prior Publication Data

US 2022/0108855 A1 Apr. 7, 2022

Related U.S. Application Data

(60) Provisional application No. 63/086,222, filed on Oct. 1, 2020.

(51) Int. Cl.
*H01H 33/02* (2006.01)
*G01R 27/16* (2006.01)
(Continued)

(52) U.S. Cl.
CPC ......... *H01H 33/666* (2013.01); *G01R 15/202* (2013.01); *G01R 27/16* (2013.01);
(Continued)

(58) Field of Classification Search
CPC .... H01H 33/666; H01H 33/38; H01H 33/027; H01H 33/668; H01H 9/00; H01H 9/54;
(Continued)

(56) References Cited

U.S. PATENT DOCUMENTS 3,636,292 A * 1/1972 Roth ................... H01H 9/541
361/13
5,166,887 A 11/1992 Farrington et al.
(Continued)

FOREIGN PATENT DOCUMENTS

WO 2014/124771 A1 8/2014

OTHER PUBLICATIONS

International Search Report and Written Opinion for International Application No. PCT/US2021/052765 dated Dec. 29, 2021. (7 pages).

*Primary Examiner* — William A Bolton

(57) ABSTRACT

A switch assembly including a switch and a high impedance element used for energy harvesting purposes that are connected to a power line and assembly electronics. The high impedance element has higher impedance than the switch so that current flows through the switch from the power line when the switch is closed and through the high impedance element from the power line when the switch is open. The switch assembly also includes a current sensing device, such as a current sensing resistor, electrically coupled in series with the high impedance element and the electronics. By measuring the current flow using the current sensing device, it is possible to infer the voltage across the high impedance element since its impedance is known. This voltage can be used to provide point on wave closing of the switch and to determine the line voltage magnitude.

20 Claims, 3 Drawing Sheets

(51) Int. Cl.
  *H01H 33/666*  (2006.01)
  *H01H 33/668*  (2006.01)
  *G01R 15/20*  (2006.01)
  *G01R 27/26*  (2006.01)

(52) U.S. Cl.
  CPC ....... *G01R 27/2605* (2013.01); *H01H 33/027* (2013.01); *H01H 33/668* (2013.01)

(58) Field of Classification Search
  CPC .... H01H 9/0005; H01H 9/0038; H01H 9/542; H01H 9/547; H01H 75/00; G01R 27/16; G01R 27/2605; G01R 15/202; G01R 15/14; G01R 21/08
  USPC .............. 218/140, 143, 102, 69, 3, 144, 145
  See application file for complete search history.

(56) References Cited

U.S. PATENT DOCUMENTS

| | | | |
|---|---|---|---|
| 5,452,172 A | 9/1995 | Lane et al. | |
| 5,747,766 A | 5/1998 | Waino et al. | |
| 5,912,604 A * | 6/1999 | Harvey | H01H 33/6662 218/138 |
| 6,687,110 B2 * | 2/2004 | Murray | H01H 33/6661 361/131 |
| 7,239,492 B2 | 7/2007 | Heimbach et al. | |
| 8,334,738 B2 * | 12/2012 | Smith | H01H 75/04 361/72 |
| 2006/0181267 A1 | 8/2006 | Marchand et al. | |
| 2009/0212898 A1 * | 8/2009 | Montante | H01H 31/006 337/171 |
| 2015/0116878 A1 * | 4/2015 | Richard | H01H 33/66 335/196 |
| 2020/0259332 A1 * | 8/2020 | Bishop | H02J 3/38 |

* cited by examiner

VOLTAGE READINGS USING HIGH VOLTAGE RESISTOR ACROSS VACUUM INTERRUPTER

CROSS-REFERENCE TO RELATED APPLICATION

This application claims the benefit of priority from the U.S. Provisional Application No. 63/086,222, filed on Oct. 1, 2020, the disclosure of which is hereby expressly incorporated herein by reference for all purposes.

BACKGROUND

Field

This disclosure relates generally to a switch assembly including a high impedance element that is used for energy harvesting purposes and a current sensing resistor for measuring current flow through the switch assembly.

Discussion of the Related Art

An electrical power distribution network, often referred to as an electrical grid, typically includes a number of power generation plants each having a number of power generators, such as gas turbines, nuclear reactors, coal-fired generators, hydro-electric dams, etc. The power plants provide power at a variety of medium voltages that are then stepped up by transformers to a high voltage AC signal to be connected to high voltage transmission lines that deliver electrical power to a number of substations typically located within a community, where the voltage is stepped down to a medium voltage for distribution. The substations provide the medium voltage power to a number of three-phase feeders including three single-phase feeder lines that carry the same current, but are 120° apart in phase. A number of three-phase and single phase lateral lines are tapped off of the feeder that provide the medium voltage to various distribution transformers, where the voltage is stepped down to a low voltage and is provided to a number of loads, such as homes, businesses, etc.

Power distribution networks of the type referred to above typically include a number of switching devices, breakers, reclosers, interrupters, etc. that control the flow of power throughout the network. A vacuum interrupter is a switch that has particular application for many of these types of devices. A vacuum interrupter employs opposing contacts, one fixed and one movable, positioned within a vacuum enclosure. When the vacuum interrupter is opened by moving the movable contact away from the fixed contact to prevent current flow through the interrupter the arc that is created between the contacts is extinguished by the vacuum at the next zero current crossing. A vapor shield is typically provided around the contacts to collect the emitted metal vapor caused by the arcing. In some designs, the vacuum interrupter is encapsulated in a solid insulation housing that has a grounded external surface.

Periodically, faults occur in the distribution network as a result of various things, such as animals touching the lines, lightning strikes, tree branches falling on the lines, vehicle collisions with utility poles, etc. Faults may create a short-circuit that increases the stress on the network, which may cause the current flow to significantly increase, for example, many times above the normal current, along the fault path. This amount of current causes the electrical lines to significantly heat up and possibly melt, and also could cause mechanical damage to various components in the network. These faults are often transient or intermittent faults as opposed to a persistent or bolted fault, where the thing that caused the fault is removed a short time after the fault occurs, for example, a lightning strike. In such cases, the distribution network will almost immediately begin operating normally after a brief disconnection from the source of power.

Fault interrupters, for example, reclosers that employ vacuum interrupters, are provided on utility poles and in underground circuits along a power line and have a switch to allow or prevent power flow downstream of the recloser. These reclosers typically detect the current and/or voltage on the line to monitor current flow and have controls that indicate problems with the network circuit, such as detecting a high current fault event. If such a high fault current is detected the recloser is opened in response thereto, and then after a short delay closed to determine whether the fault is a transient fault. If high fault current flows when the recloser is closed after opening, it is immediately re-opened. If the fault current is detected a second time, or multiple times, during subsequent opening and closing operations indicating a persistent fault, then the recloser remains open, where the time between detection tests may increase after each test. For a typical reclosing operation for fault detection tests, about 3-6 cycles or 50 to 100 ms of fault current pass through the recloser before it is opened, but testing on delayed curves can allow fault current to flow for much longer times.

The type of vacuum interrupters referred to above are sometimes employed in single phase self-powered magnetically actuated reclosers. These types of magnetically actuated reclosers typically employ spring mechanisms or magnetic actuators that open and close the interrupter contacts. For one type of magnetic actuator, an armature is provided that is moved by an opening coil to open the vacuum interrupter and a closing coil to close the vacuum interrupter, where the armature and a stator provide a magnetic path for the flux produced by the coils. The coils are de-energized after the actuator is moved to the open or closed position, and permanent magnets are used to hold the armature against a latching surface in the open or closed position.

Reclosers of the types disclosed herein can be separated into two general categories, namely, series configuration devices that employ current transformers for energy harvesting purposes to provide the self-power and that are in electrical series with the power line and are floating with respect to ground, and shunt configuration devices that employ power transformers for energy harvesting purposes to provide the self-power and that are connected to the power line and ground. Since it is often desirable to reduce the size and weight of these types of reclosers for a number of reasons, such as reducing cost and installation complexity by being able to install and remove the switches from the pole on which they are mounted using a hot stick, the series configuration reclosers are becoming more popular because they do not require insulation and the necessary robustness to withstand the full line voltage. Power transformers are typically large and bulky because of the requirement that they be electrically insulated.

Because the series configuration reclosers referred to above are floating relative to a reference potential and not connected to ground, it is challenging for these reclosers to measure line voltage. Because these reclosers cannot effectively measure voltage they cannot perform point on voltage wave closing operations. In other words, during the reclosing operation discussed above, the vacuum interrupter contacts in the recloser are closed without regard to the voltage phase angle. This results in a random closing angle that often creates an asymmetrical fault current, where the current cycle is offset from zero, i.e., has high magnitude peaks in one polarity and lower peaks in the reverse polarity relative to zero. The high magnitude fault current peaks, depending on the length of time they are occurring, causes significant forces and stresses on the components in the network that may reduce their life. For the traditional reclosing operation having current flow times over 3-6 cycles and longer times for delayed curve operation, these forces and stresses can be considerable. Further, these fault interrupters are generally not capable of determining the magnitude of the line voltage, which could lead to better coordination schemes. For example, if the fault interrupter had knowledge of the line voltage, it could adjust its voltage curve to better protect the distribution transformer by just knowing the size of the transformer.

SUMMARY

The following discussion discloses and describes a switch assembly including a switch and a high impedance element used for energy harvesting purposes that are connected to a power line at one end and assembly electronics at an opposite end, where in one non-limiting embodiment the switch assembly has particular application for use in connection with a vacuum interrupter. The high impedance element has higher impedance than the switch so that current flows through the switch from the power line when the switch is closed and through the high impedance element from the power line when the switch is open, where power from the high impedance element can be harvested to power a switch closing device, such as a magnetic actuator. The high impedance element can be a resistive element, a capacitive element or a combination of a resistive and capacitive element. The switch assembly also includes a current sensing device, such as a current sensing resistor, electrically coupled in series with the high impedance element and the electronics. By measuring the current flow using the current sensing device, it is possible to infer the voltage across the high impedance element since its impedance is known. This voltage can be used to provide point on wave closing of the switch and to determine the line voltage magnitude.

Additional features of the disclosure will become apparent from the following description and appended claims, taken in conjunction with the accompanying drawings.

DETAILED DESCRIPTION OF THE EMBODIMENTS

The following discussion of the embodiments of the disclosure directed to a switch assembly including a switch and a high impedance element used for energy harvesting purposes that are electrically connected to a power line in parallel at one end and assembly electronics at an opposite end and a current sensing resistor electrically coupled in series with the high impedance element is merely exemplary in nature, and is in no way intended to limit the disclosure or its applications or uses. For example, the discussion herein refers to the switch assembly as being part of a recloser having a vacuum interrupter. However, as will be appreciated by those skilled in the art, the switch assembly will have other applications.

Figure 1:
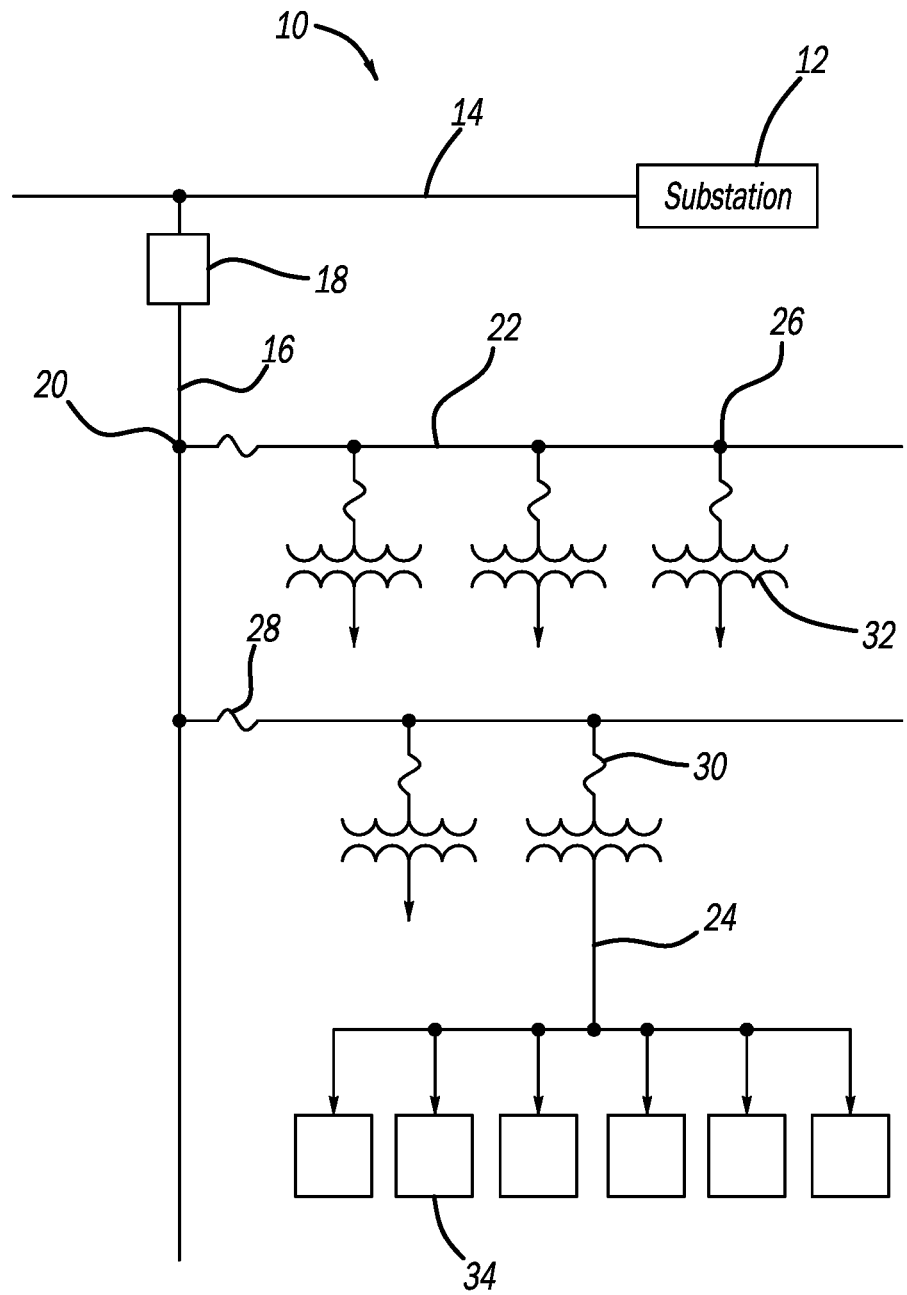
FIG. 1 is a schematic diagram of a power distribution network.

FIG. 1 is a schematic type diagram of an electrical power distribution network 10 including an electrical substation 12 that steps down high voltage power on a high voltage power line (not shown) to medium voltage power, such as 12-47 kV, provided on a substation bus 14. A three-phase feeder 16 is connected to the bus 14 and a recloser 18 is provided proximate the connection point between the feeder 16 and the bus 14. The recloser 18 is intended to represent any reclosing or fault interrupter device of the type discussed above, and would typically include a vacuum interrupter for opening and closing the recloser 18 to allow or prevent current flow therethrough on the feeder 16, possibly sensors for measuring the current and/or voltage of the power signal propagating on the feeder 16, a controller for processing the measurement signals and controlling the position of the interrupter, and a transceiver for transmitting data and messages to a control facility (not shown) and/or to other reclosers and components in the network 10. The network 10 includes a number of single-phase lateral lines 22 coupled to the feeder 16 usually at a utility pole 20 and a number of a secondary service lines 24 coupled to each lateral line 22 usually at a utility pole 26, where a lateral fuse 28 is provided at the connection point between each lateral line 22 and the feeder 16 and a primary fuse 30 is provided at the connection point between each lateral line 22 and each service line 24. A distribution transformer 32 is provided at the beginning of each service line 24 that steps down the voltage from the medium voltage to a low voltage to be provided to loads 34, such as homes.

Figure 2:
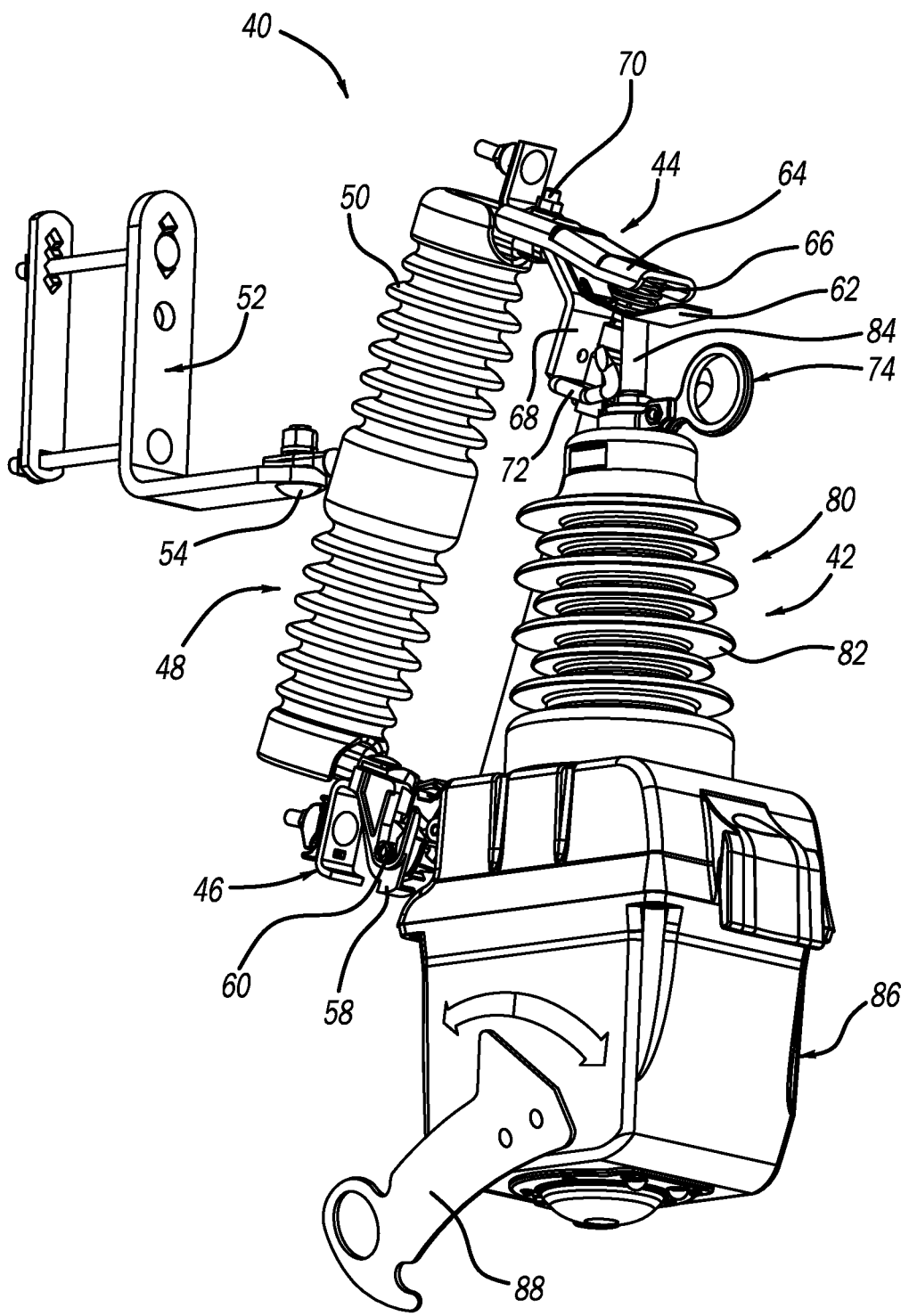
FIG. 2 is an isometric view of a switch assembly connected to a pole mounted insulator and including a vacuum interrupter.

FIG. 2 is an isometric view of a pole mounted switch assembly 40 including a single phase self-powered magnetically actuated switching device 42 intended to represent any suitable device including components for use as the recloser 18 or devices that can be used instead of the fuses 28 and 30. The switching device 42 is coupled to a mounting assembly 44 at one end and a mounting hinge 46 at an opposite end. The mounting assembly 44 is secured to one end of an insulator 48 having skirts 50 and the mounting hinge 46 is secured to an opposite end of the insulator 48, where the insulator 48 is mounted to a bracket 52 by a bolt 54 that may be attached to a utility pole (not shown). The mounting hinge 46 includes a channel catch 58 that accepts a trunnion rod 60 coupled to the device 42 and that is electrically coupled to a unit bottom contact (not shown). The mounting assembly 44 includes a top mounting tab 62, an extension tab 64 and a spring 66 positioned between the tabs 62 and 64. The mounting assembly 14 also includes a support tab 68 bolted to the extension tab 64 by a bolt 70 and a pair of mounting horns 72 coupled to and extending from the support tab 68 opposite to the extension tab 64. A guiding pull ring member 74 is coupled to a top of the device 42 and allows a worker to easily install and remove the device 42 from the utility pole pulling on the ring member 74 to disconnect the device 42 from the mounting assembly 44, rotating the device 42 outward on the trunnion rod 60 and then lifting the device 42 out of the catch 58. Although the device 42 is shown and described herein as being mounted to a utility pole, it is noted that this is by way of a non-limiting example in that the device 42 may have application for other locations in a medium voltage power network, such as in a pad mounted or sub-surface switchgear.

The switching device 42 includes a vacuum interrupter 80 having an outer insulation housing 82 that encloses vacuum interrupter switch contacts (not shown) of the type referred to above, where the vacuum interrupter 80 can be any vacuum interrupter known in the art for medium voltage uses that is suitable for the purposes discussed herein. More particularly, the vacuum interrupter 80 defines a vacuum chamber that encloses a fixed contact (not shown) that is electrically coupled to a unit top contact 84 and a movable contact (not shown) that is electrically coupled to the unit bottom contact, where the fixed and movable contacts are in contact with each other within the vacuum chamber when the vacuum interrupter 80 is closed. When the vacuum interrupter 80 is opened by moving the movable contact away from the fixed contact the arc that is created between the contacts is extinguished by the vacuum at a zero current crossing. The switching device 42 also includes an enclosure 86 that encloses a magnetic actuator or other device that opens and closes the vacuum interrupter 80, various electronics, energy harvesting devices, sensors, communications devices, etc. consistent with the discussion herein. A lever 88 allows the switching device 42 to be manually opened and closed using any suitable technique.

As discussed above, switches of the type of the switching device 42 include energy harvesting devices that harvest energy from the power line that can then be used to power the magnetic actuator within the enclosure 86 to close the switching device 42 and power the various electronics associated with the switching device 42. However, the energy harvesting devices for both the series configuration devices and shunt configuration devices have significant size and weight in order to provide the necessary power to actuate the movable vacuum interrupter contact. For example, current transformers are typically large and bulky because the core needs to be large enough to provide enough power to operate the actuator to open the switch at low current levels. A different kind of energy harvesting device has been proposed.

Figure 3:
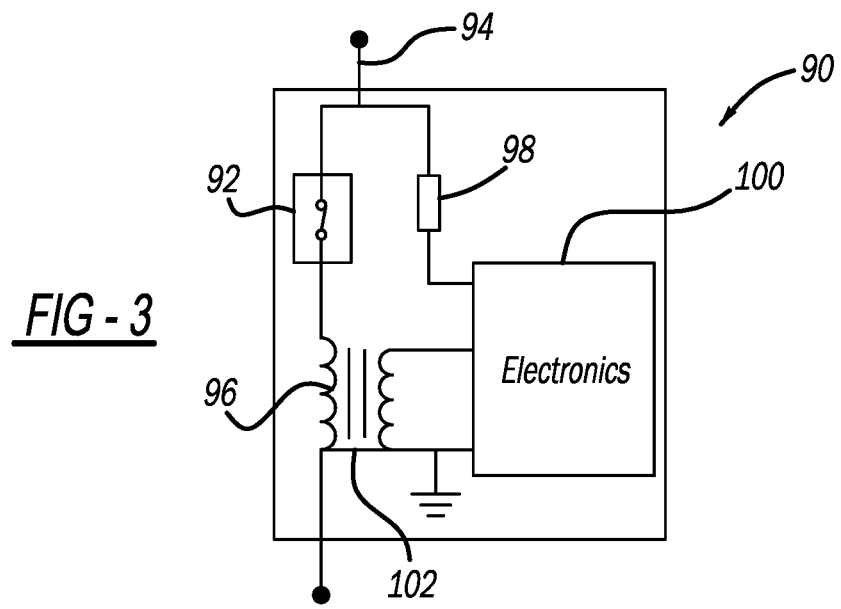
FIG. 3 is a schematic diagram of a switch circuit including a high impedance element electrically coupled to a power line and electronics, where the high impedance element is used for energy harvesting purposes.

FIG. 3 is a schematic diagram of a switch circuit 90 of the series configuration type including a switch 92 representing, for example, the contacts in the vacuum interrupter 80 that is electrically coupled to line 94 representing the power line, a current transformer 96 that provides power to an electronics box 100 when the switch 92 is closed and a high impedance element 98, such as a resistive element, a capacitive element or a combination of a resistive and capacitive element, that provides power to the electronics box 100 when the switch 92 is open. The electronics box 100 includes various circuits and devices, such as a magnetic actuator, sensors, processors, communications devices, power storage devices, etc. When the switch 92 that has low impedance in the closed state is closed, the high impedance of the element 98 prevents current flow through it and current flows through the switch 92 to the current transformer 96 to provide power to the electronics box 100, where the current transformer 96 is relatively small because it only powers electronics and a small amount of power to actuate the switch 92 to the open position. When the switch 92 is open, current from the line 94 flows through the element 98 and provides power to operate the electronics box 100 and operate the magnetic actuator to close the switch 92 on line 102.

As discussed above, for these switching devices that are floating and not directly connected to the power line, it is difficult to get an accurate voltage measurement. This disclosure proposes measuring the current flow through the high impedance element 98 when the switch 92 is open and the element 98 is directly connected to the power line 94, and then determining the voltage across the switch circuit 90 using the measured current, which will be nearly the same as the line voltage.

Figure 4:
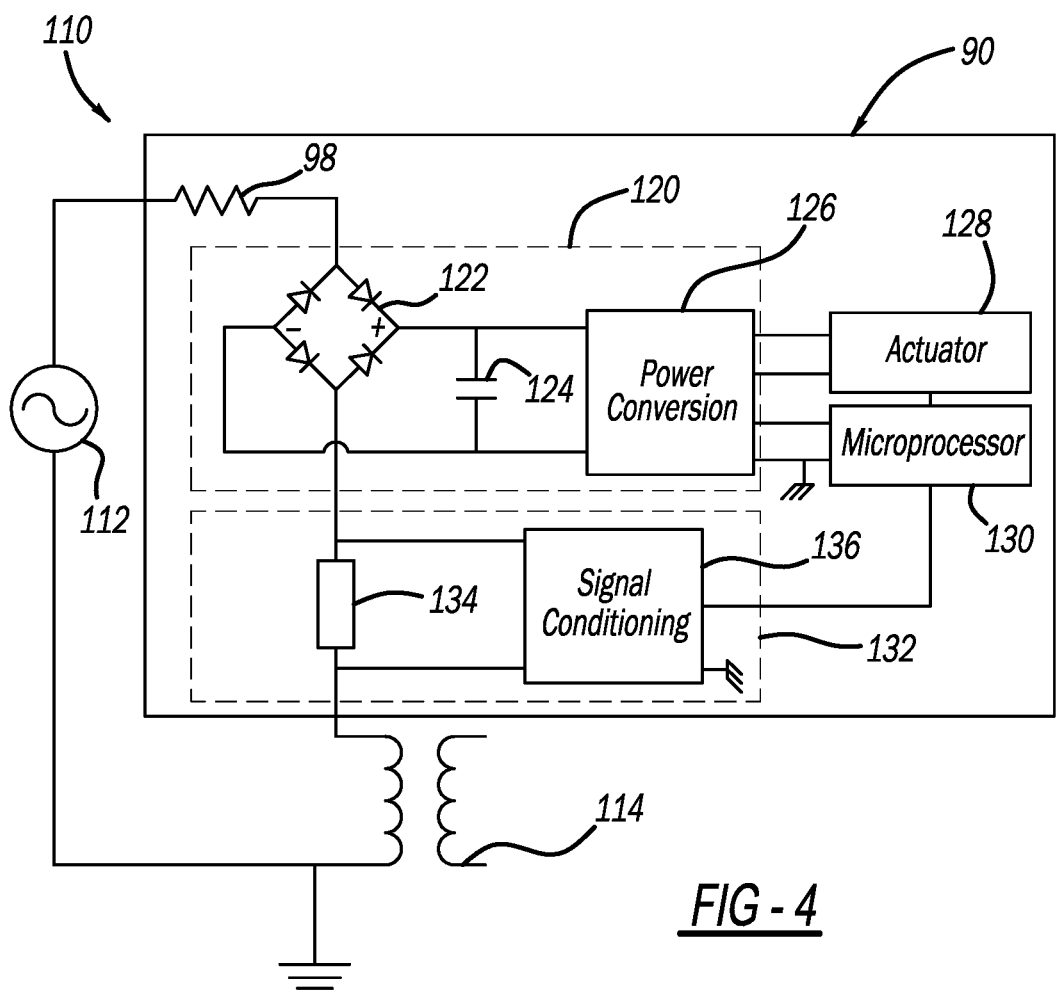
FIG. 4 is a schematic diagram of a power circuit including an equivalent circuit of the switch circuit shown in FIG. 3 when the switch is in an open state and a current measuring resistor.

FIG. 4 is a schematic diagram of a power circuit 110 including an equivalent circuit to the switch circuit 90 when the switch 92 is open, where like elements are identified by the same reference number. It is noted that some of the elements in the circuit 90 shown in FIG. 3 are not shown in FIG. 4 and some of the elements in the circuit 90 shown in FIG. 4 are not shown in FIG. 3. It is further noted that the switch 92 is not shown in FIG. 4, but it is in the open position so that current from the power line 94, represented by an AC source 112, is flowing through the high impedance element 98, shown here as a resistor. The current flows through the circuit 90 to ground through a network component shown here as a distribution transformer 114, such as, for example, one of the distribution transformers 32, although, as will be appreciated by those skilled in the art, other network components will be applicable in other designs that allow the element 98 to be connected to ground. When the switch 92 is closed, the impedance of the circuit 90 is a lot smaller than the impedance of the distribution transformer 114, and therefore the circuit 90 is at a floating potential. When the switch 92 is open, the impedance of the circuit is a lot larger than the impedance of the distribution transformer 114, and therefore the circuit will be near ground potential. The circuit 90 includes an energy harvesting sub-circuit 120 having a bridge rectifier 122 that converts the alternating current to direct current, a storage capacitor 124 that stores energy from the rectifier 122 and a power conversion device 126 that regulates the stored energy for operating an actuator 138 that closes the switch 92. A microprocessor 130 controls the operation of the circuit 90 consistent with the discussion herein.

In order to measure the current flow through the element 98, some type of current sensing device 134 coupled in electrically series with the element 98 is provided. In one embodiment, the current sensing device 134 is a current sensing resistor that is used to provide a voltage drop for current measurement purposes, where the current sensing resistor has a much smaller resistance than the element 98. The current flow through the current sensing device 134 when the switch 92 is open is measured by a signal conditioning circuit 136, where the current flow through the element 134 is the same as the current flow through the element 98. Thus, the voltage across the element 98 can be determined by the microprocessor 130 by multiplying the current times the known resistance of the element 98 when the switch 92 is open, which will be nearly the same as the line voltage because of the high impedance of the element 98. This voltage can then be used by the microprocessor 130 to determine the magnitude and angle of the voltage using a discrete Fourier transform, which can then be used for point on wave closing of the switch 92 for reclosing purposes and to determine the line voltage for other system operations that require an accurate line voltage determination, such as using the voltage magnitude to provide better protection and coordination of the distribution transformer 114. Other suitable sensing devices can be employed for the current sensing device 134, such as a Hall effect sensor, that provide a voltage that is proportional to the current flow.

In an alternate embodiment, the current sensing device 134 can be removed and the voltage across the circuit 90 can be determined using the energy harvesting sub-circuit 120. Specifically, by determining how fast the capacitor 124 charges when the switch 92 is opened the voltage can be determined because the faster the current flows the higher the voltage and the faster the capacitor 124 will charge.

The foregoing discussion discloses and describes merely exemplary embodiments of the present disclosure. One skilled in the art will readily recognize from such discussion and from the accompanying drawings and claims that various changes, modifications and variations can be made therein without departing from the spirit and scope of the disclosure as defined in the following claims.

What is claimed is:

1. A switch assembly comprising:
   a switch electrically coupled at one end to a power line and at an opposite end to electronics that are connected to a load;
   a high impedance element coupled at one end to the power line and at an opposite end to the electronics, the high impedance element having higher impedance than the switch so that current flows through the switch from the power line when the switch is closed and through the high impedance element from the power line when the switch is open;
   a current sensing device electrically coupled in series with the high impedance element and the electronics; and
   a control system operable to measure current flow using the current sensing device and calculate a voltage drop across the high impedance element using the measured current flow.

2. The switch assembly according to claim 1 wherein the current sensing device is a current sensing resistor.

3. The switch assembly according to claim 1 wherein the current sensing device is a Hall effect sensor.

4. The switch assembly according to claim 1 wherein the control system determines a magnitude and angle of the voltage drop across the high impedance element.

5. The switch assembly according to claim 4 wherein the control system uses the magnitude and angle of the voltage to provide point on wave closing of the switch.

6. The switch assembly according to claim 4 wherein the control system uses the voltage magnitude to provide better distribution transformer protection and coordination.

7. The switch assembly according to claim 1 wherein the high impedance element is a resistive element.

8. The switch assembly according to claim 1 wherein the high impedance element is a capacitive element.

9. The switch assembly according to claim 1 wherein the high impedance element is a combination of a resistive and capacitive element.

10. The switch assembly according to claim 1 wherein the switch assembly is part of a vacuum interrupter and the switch is provided within a vacuum chamber defined by a vacuum housing.

11. The switch assembly according to claim 1 wherein one of the electronics is a switch closing device, the switch closing device being powered through the high impedance element to close the switch when it is open.

12. The switch assembly according to claim 11 wherein the switch closing device is a magnetic actuator.

13. The switch assembly according to claim 1 wherein the electronics include sensors, processors, communications devices and power storage devices.

14. The switch assembly according to claim 1 wherein the switch assembly is part of a self-powered magnetically actuated recloser.

15. A vacuum interrupter for controlling power flow on a power line, the vacuum interrupter comprising:
    electronics including a switch closing device;
    a switch electrically coupled at one end to the power line and at an opposite end to the electronics;
    a resistive element coupled at one end to the power line and at an opposite end to the electronics, the resistive element having higher impedance than the switch so that current flows through the switch from the power line when the switch is closed and through the resistive element from the power line when the switch is open, the switch closing device being powered through the resistive element to close the switch when it is open;
    a current sensing resistor electrically coupled in series with the high impedance element and the electronics, the current sensing resistor having a lower resistance than the resistance of the resistive element; and
    a control system operable to measure current flow using the current sensing resistor and calculate a voltage drop across the high impedance element using the measured current flow.

16. The vacuum interrupter according to claim 15 wherein the control system determines a magnitude and angle of the voltage drop across the resistive element.

17. The vacuum interrupter according to claim 16 wherein the control system uses the magnitude and angle of the voltage to provide point on wave closing of the switch.

18. The vacuum interrupter according to claim 16 wherein the control system uses the voltage magnitude to provide better distribution transformer protection and coordination.

19. The vacuum interrupter according to claim 15 wherein the switch closing device is a magnetic actuator.

20. The vacuum interrupter according to claim 15 wherein the vacuum interrupter is part of a self-powered magnetically actuated recloser.

* * * * *